United States Patent [19]

Harper

[11] Patent Number: 5,019,234

[45] Date of Patent: May 28, 1991

[54] SYSTEM AND METHOD FOR DEPOSITING TUNGSTEN/TITANIUM FILMS

[75] Inventor: Guy A. Harper, San Jose, Calif.

[73] Assignee: VLSI Technology, Inc., San Jose, Calif.

[21] Appl. No.: 537,470

[22] Filed: Jun. 8, 1990

[51] Int. Cl.$^5$ ...................... C23C 14/34; H01L 21/441
[52] U.S. Cl. ........................... 204/192.17; 204/298.23; 204/298.25; 437/190; 437/192
[58] Field of Search ...................... 204/298.23, 298.25, 204/298.26, 298.27, 298.28, 298.29; 437/189, 190, 192, 194, 246

[56] References Cited

U.S. PATENT DOCUMENTS

| | | | |
|---|---|---|---|
| 4,465,716 | 8/1984 | Baber et al. | 437/192 X |
| 4,500,407 | 2/1985 | Boys et al. | 204/298.25 |
| 4,749,465 | 6/1988 | Flint et al. | 204/298.25 |
| 4,851,101 | 7/1989 | Hutchinson | 204/298.25 X |
| 4,914,055 | 4/1990 | Gordon et al. | 437/192 |
| 4,923,584 | 5/1990 | Bramham, Jr. et al. | 204/298.25 |

Primary Examiner—Nam X. Nguyen
Attorney, Agent, or Firm—Flehr, Hohbach, Test, Albritton & Herbert

[57] ABSTRACT

To form a metal layer on a semiconductor wafer, a first portion of a first tungsten/titanium layer is formed by sputtering tungsten/titanium onto the semiconductor wafer in a first evacuated sputter station. A second portion of the first tungsten/titanium layer is then sputtered on in a second evacuated sputter station. Then the tungsten/titanium layer is exposed to air before forming an aluminum layer on top of the tungsten/titanium layer. Finally, a second tungsten/titanium layer is deposited on the aluminum layer. By forming the first tungsten/titanium layer in two steps two sequential sputter stations, the amount of tungsten/titanium deposited onto each sputter station's hardware and shielding is reduced during the processing of each semiconductor wafer, thereby increasing the number of wafers which can be processed by the sputter stations before the tungsten/titanium deposited on the sputter stations' hardware and shielding needs to be removed. The step of exposing the first tungsten/titanium layer to air causes at least partial oxidation of the titanium in the first tungsten/titanium layer and thereby decreases the resistivity of the entire metal sandwich. Exposure of the first tungsten/titanium layer to air also increases the performance of this layer as a diffusion barrier—i.e., as a barrier to diffusion of aluminum into the substrate.

8 Claims, 2 Drawing Sheets

SYSTEM AND METHOD FOR DEPOSITING TUNGSTEN/TITANIUM FILMS

The present invention relates generally to metal layer deposition processes used in semiconductor circuit manufacturing and particularly to methods and systems for depositing tungsten/titanium layers on a semiconductor wafer.

BACKGROUND OF THE INVENTION

Referring to FIG. 1, the primary component of a typical metal interconnect layer 100 used in semiconductor circuits is aluminum. However, it is well known that aluminum migrates or diffuses into silicon, especially when an aluminum layer is in direct contact with a silicon substrate or region and the wafer 110 is subjected to high temperatures during processing of the wafer subsequent to the deposition of the metal layer. When using very small and thin semiconductor device structures, such as those which have become common in the late 1980's, the diffusion of aluminum into the silicon substrate causes undesirable leakage currents and device failures.

As shown in FIG. 1, a wafer 110 has a P− silicon substrate 120, in which has been formed a N+ region 122 (e.g., a source or drain region) which is bounded by field oxide 124 on either side. On top of the field oxide 124 is a thin intermediate oxide layer 126. A metal layer 100 interconnection to the N+region is then formed on top of the oxide layer 124–126.

One of the standard solutions to the problem of aluminum diffusion is to form a thin tungsten/titanium (W/Ti) layer 132 between an aluminum layer 134 and the substrate 120. The W/Ti layer 132 acts as a barrier which prevents diffusion of aluminum from the aluminum layer 134 into the substrate 120 (actually the N+region 122), thereby overcoming the aluminum diffusion problem. Similarly, a second tungsten/titanium (W/Ti) layer 136 is deposited on top of the aluminum layer 134. Frequently, grains of aluminum along the surface of an aluminum layer form "hillocks", i.e., vertically displaced grains, which are known to cause circuit failures. The second W/Ti layer 136 forms a compressive cap which helps to prevent hillocking of the aluminum. It also reduces the reflectivity of the entire metal sandwich 100, which facilitates photolithographic masking of the metal sandwich.

Referring to FIGS. 2 and 3, depositing W/Ti layers is, unfortunately, a very dirty process. FIG. 2 depicts a standard prior art sputter system 150, such as the Varian Model 3190 Sputter System. The sputter system 150 includes a load-lock port 152 for receiving wafers from an automatic wafer handling system (shown in part at reference numeral 154) and for returning wafers after processing back to the wafer handling system. The silicon wafers being processed are automatically removed from trays 156 of wafers which move along a track 158 as shown.

There are four stations 160, 162, 164 and 166 in the sputter system, each of which is used to perform a sequentially ordered processing step under the direction of a microprocessor controller 170. In other words, each wafer being processed automatically moves through these four stations 160–166 before being returned to the wafer tray 156 from which it came. Typically, one or more of the stations is used to perform preparatory steps, such as a plasma etch or wafer bake, and two or more of the stations are used for sputtering such materials as aluminum/copper (Al/Cu) or Tungsten/Titanium (W/Ti) onto a wafer. In the preferred embodiment, the aluminum/copper films deposited are approximately ninety-nine percent aluminum and one percent copper. The tungsten/titanium films deposited are approximately ninety percent tungsten and ten percent titanium.

FIG. 3 depicts one sputter station 162 of the sputter system 150 shown in FIG. 2. It should be understood that the sputter system 150 is designed so that any of the stations 160–166 of the system can be configured to perform any of the processing steps for which the system is designed, including heating, etching and sputtering. It should also be understood that all the stations 160–166 of the sputter system 150 are part of one evacuated chamber. The evacuated chamber is backfilled with argon at a partial pressure of about seven millitorr and is essentiallY devoid of air, with partial pressures for water and nitrogen each between $10^{-8}$ and $10^{-12}$ torr.

The one station 162 shown in FIG. 3 is configured for sputtering metal onto a target wafer. Station 162 includes a heater assembly 200 for heating and holding a wafer 202, as well as a metal source assembly 210. The metal source assembly 210 contains a metal cathode 212 which sputters metal onto the wafer 202. Unfortunately, metal from the source assembly 210 also sputters onto shielding 220 which surrounds the wafer 202 and which serves to protect the station 162 from becoming encrusted with sputtered metal. As will be understood by those skilled in the art, FIG. 3 only schematically represents the station's components and that the shielding 220 actually consists of several components.

FIG. 4 shows the configuration of a sputter system as used by the applicant prior to the present invention. This configuration is standard prior art. In particular, the first station 160 in the machine is used for an RF etch, which cleans the wafer prior to metal deposition. In the second station 162 twenty-two hundred (2200) angstroms of W/Ti are deposited on the wafer. Sputtering is performed in an argon atmosphere in which all or virtually all oxygen has been removed. Next, without exposing the wafer to air, an aluminum/copper film is deposited on the wafer by the third station 164 and then a second W/Ti layer (of about 825 angstroms) is deposited on top of the aluminum/copper film in the fourth station 166. These steps build up the circuit profile shown in FIG. 1.

After processing many wafers, there is a significant build up of sputtered metal inside the sputter chamber, particularly on the shielding 220 in the station 162. The deposition of Tungsten/Titanium films has always been a very dirty process. The high compressive stress of films deposited inside the sputter chamber causes flaking from the sputter chamber's internal components when the build up of W/Ti films reaches a critical level.

In particular, as the W/Ti films in a sputter system chamber approaches a thickness of 330 microns, the W/Ti film begins to relieve stress by flaking. This causes contamination of the wafers being processed, which causes product defects and requires that the sputter system be shut down for cleaning. During cleaning the shielding 220 in the sputter chamber is replaced, which requires disassembly of the sputter chamber—a time consuming process.

In general, using prior art manufacturing methods, cleaning of the W/Ti sputter chamber is an expensive process which must be repeated after processing about 1500 wafers, assuming a deposition of 2200 angstroms of W/Ti for each wafer.

It is a primary goal of the present invention to reduce the frequency with which sputter chambers used for depositing W/Ti films need to be cleaned. Related goal is to improve the quality of the W/Ti films deposited on wafers, and to improve the quality of the diffusion barrier provided by thin W/Ti films so that the thickness of the W/Ti films used can be decreased.

SUMMARY OF THE INVENTION

In summary, the present invention is a method of depositing metal layers on semiconductor wafers. A first portion of a first tungsten/titanium layer is formed on a semiconductor wafer by sputtering tungsten/titanium onto the semiconductor wafer in a first evacuated sputter station. A second portion of the first tungsten/titanium layer is then formed by sputtering tungsten/titanium onto the semiconductor wafer in a second evacuated sputter station. Then the tungsten/titanium layer is exposed to air before forming an aluminum layer on top of the tungsten/titanium layer. Finally, a second tungsten/titanium layer is deposited on the aluminum layer. The first tungsten/titanium, aluminum and second tungsten/titanium layers together comprise a metal sandwich (sometimes called a composite metal layer, or just a metal layer) 100 on the semiconductor wafer which can be masked and patterned to form a patterned set of metal interconnections.

By forming the first tungsten/titanium layer in two steps in two sequential sputter stations, the amount of tungsten/titanium deposited onto each sputter station's shielding is reduced during the processing of each semiconductor wafer, thereby increasing the number of wafers which can be processed by the sputter system before the tungsten/titanium deposited on the sputter station shielding needs to be removed.

The step of exposing the first tungsten/titanium layer to air causes at least partial oxidation of the titanium in the first tungsten/titanium layer and decreases the resistivity of the entire metal sandwich. Exposure of the first tungsten/titanium layer to air also improves the performance of this layer as a diffusion barrier—i.e., as a barrier to diffusion of aluminum into the substrate.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
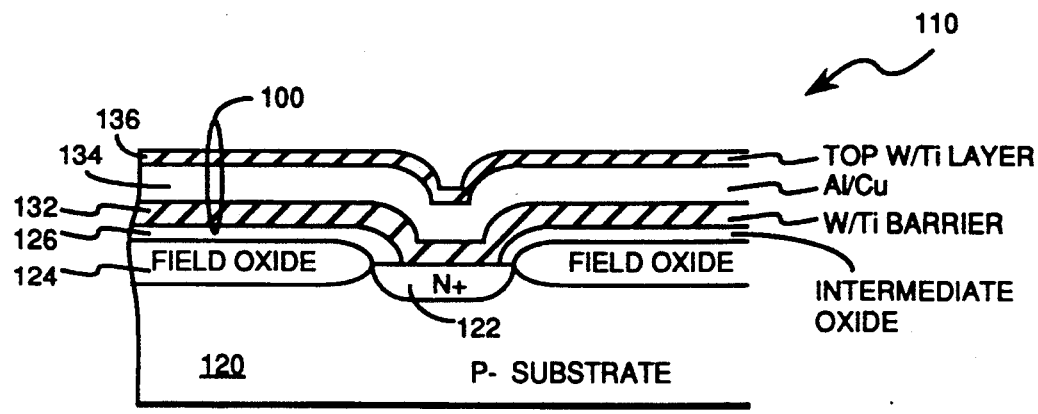
FIG. 1 depicts a semiconductor wafer with a metal layer deposited thereon for forming a circuit connection.
Figure 2:
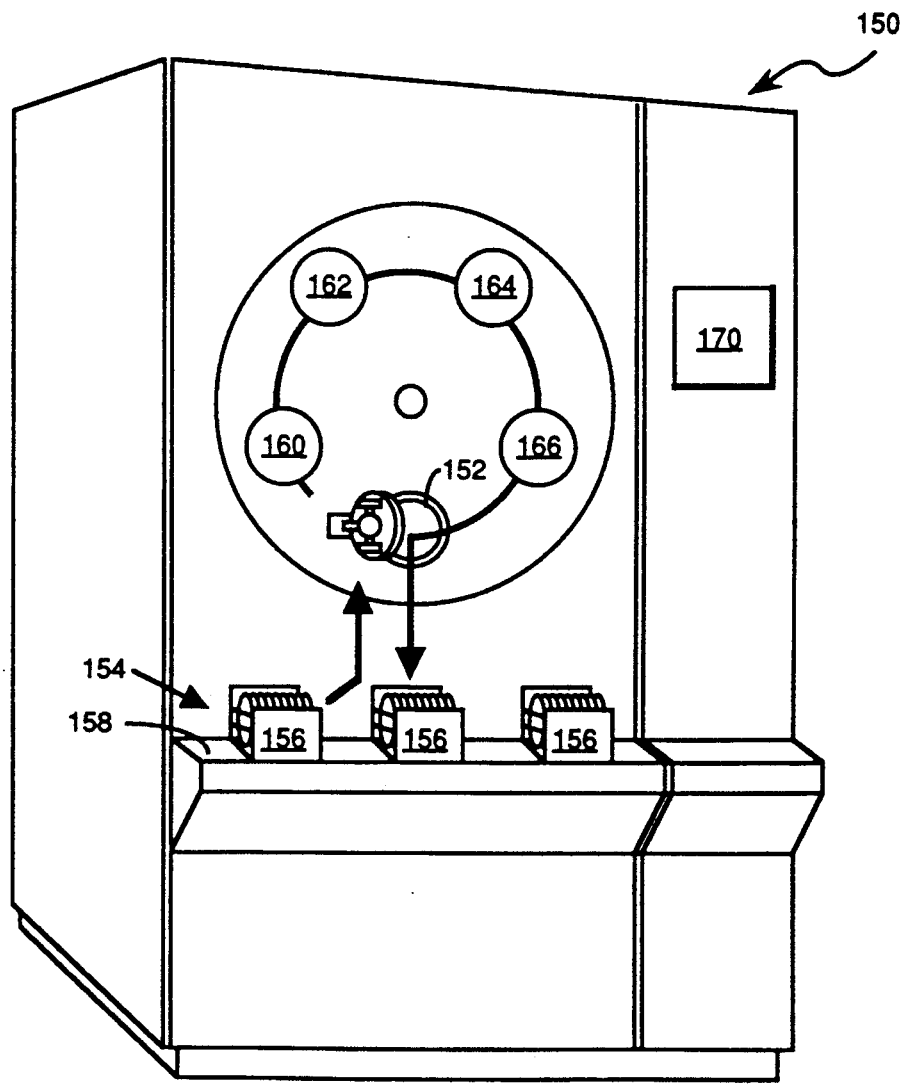
FIG. 2 depicts a prior art metal sputtering system.
Figure 3:
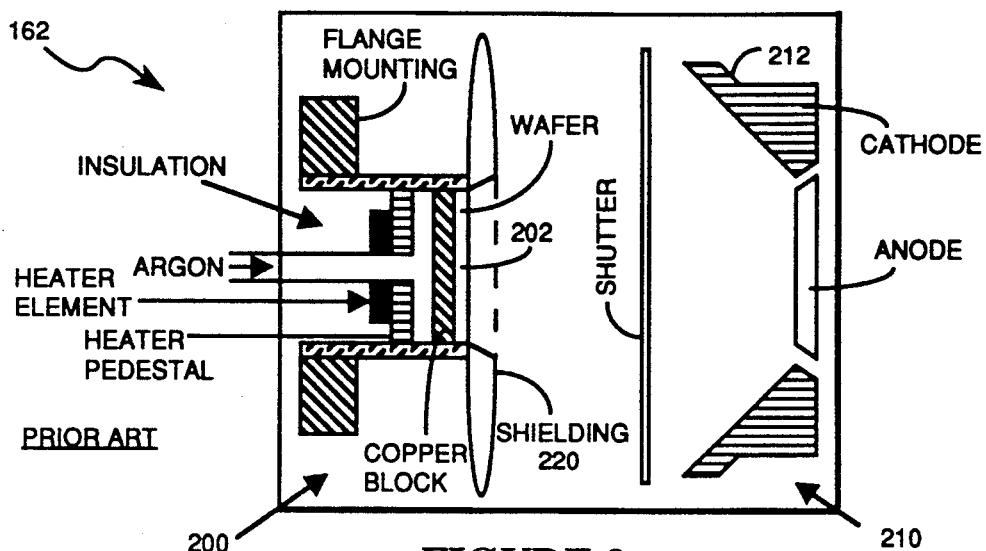
FIG. 3 depicts one sputter station of the sputtering system in FIG. 2.
Figure 4:
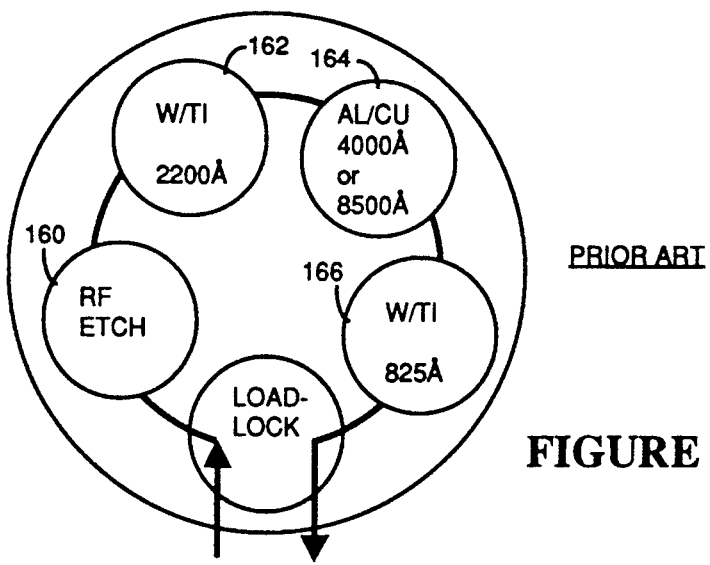
FIG. 4 depicts a prior art configuration of the stations in the sputtering system shown in FIG. 2 for depositing a metal layer on a semiconductor wafer.

As described above with reference to FIG. 4, the standard prior art method of forming Tungsten/Titantium barrier films above and below an aluminum/copper layer is to sequentially make three depositions in stations 162, 164 and 166 without exposing the wafer to air or oxygen. The bottom 2200 angstrom thick Tungsten/Titantium layer 132 is deposited in station 162, followed by a deposition of a aluminum/copper layer 134 in station 164 and a deposition of a thin (825 angstrom) Tungsten/Titantium layer 136 in station 166. The problem with this prior art method of forming Tungsten/Titantium barrier films is that Tungsten/Titanium films build up inside station 162 and begin to flake off after processing approximately 1500 wafers. This flaking effectively destroys wafers and therefore the metal deposition system must be shut down for cleaning after processing just 1500 wafers.

Figure 5:
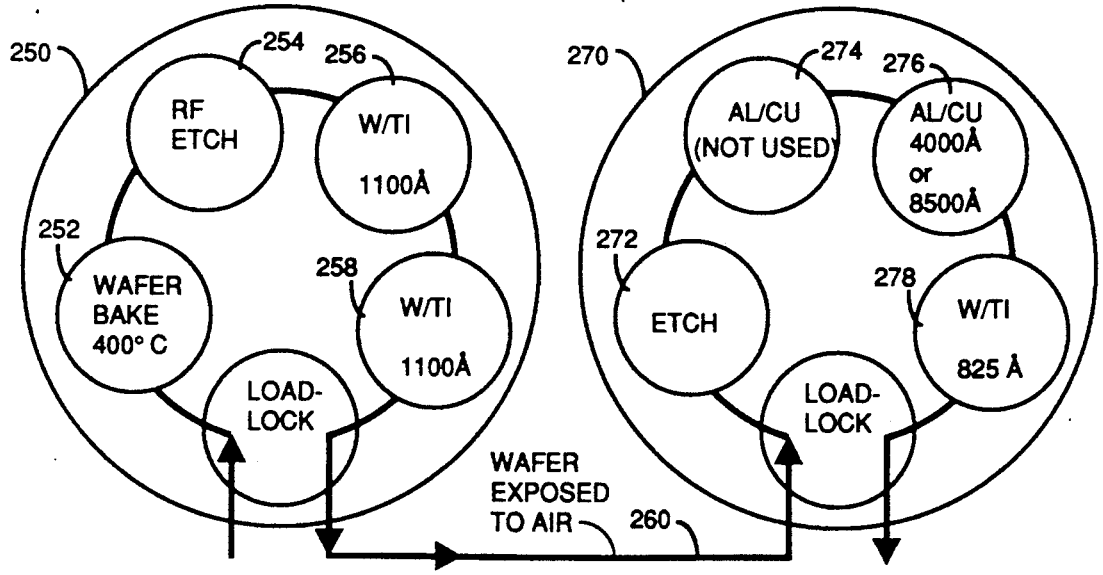
FIG. 5 depicts a new configuration of the stations in two sequentially used sputtering systems of the type shown in FIG. 2 for depositing a metal layer on a semiconductor wafer.

Referring to FIG. 5, the present invention works as follows. The processing which was performed by one deposition system is now performed by two deposition systems 250 and 270. While this equipment is expensive, the present invention greatly increases the interval between system shutdowns required for cleaning.

In the first deposition system 250, the wafer is first baked at 400 degrees Celsius for approximately one minute in station 252. In the second station 254 the wafer is RF etched, which cleans the wafer prior to metal deposition. In the third station 256 eleven hundred angstroms of W/Ti are deposited on the wafer. Then, in the fourth station 258 another eleven hundred angstroms of W/Ti are deposited on the wafer. Thus the bottom 2200 angstroms of W/Ti film 132 is deposited in two sequential steps.

An important advantage of depositing the bottom W/Ti layer 132 in two sequential stations is that only 1100 angstroms are deposited on any one station's interior. As a result, approximately three thousand (3000) wafers can be processed by the sputter system 250 before the metal deposition system 250 must be shut down for cleaning (i.e., replacement of the sputter shielding 220 and the like).

Next, the wafer exits the first sputter system 250 and is transported to the second sputter system 270 on wafer movement system 260, during which time the wafer is exposed to air, causing the top surface of the W/Ti layer 132 to become at least partially oxidized.

In the second sputter system, the first station 272 is an RF etch station which is not used during this process. The wafers are simply rotated past this station to the second station 274.

An Al/Cu layer is deposited in either station 274 or 276 and the top W/Ti barrier film of 825 angstroms is deposited in station 278.

The partial oxidation of the W/Ti layer 132 reduces the amount of $TiAl_3$ formed when the Al/Cu layer is deposited on top of it. $TiAl_3$ has a relatively high resistivity, and thus the presence of $TiAl_3$ forms a high resistivity interface in the metal sandwich structure 132-134-136. Measurements have shown that the metal sandwich structures formed using the present invention have a lower resistivity than those formed using the prior art manufacturing technique.

Furthermore, exposing the wafer to air also causes the formation of titanium nitride along the surface of the wafer. The titanium nitride fills in gaps between grains of tungsten/titanium on the wafer's surface and thereby enhance the diffusion barrier performance of the W/Ti layer 132.

Experiments on the W/Ti layer 132 formed using the present invention have shown superior diffusion barrier performance compared with the W/Ti layers formed using the prior art manufacturing technique. As a result, the inventor has experimented with thinner W/Ti layers 132 and has found that W/Ti layers of 2000 angstroms and even 1800 angstroms show zero leakage failures when the W/Ti layer is exposed to air before deposition of the Al/Cu film. Using W/Ti layers of 2000 angstroms, manufactured by depositing 1000 angstroms in each of two sequential sputtering stations 256 and 258 would allow processing of 3300 wafers before having to shut down the sputter system for cleaning (as opposed to 3000 wafers when using 2200 angstrom W/Ti layers). Using W/Ti layers of 1800, manufactured by depositing 900 angstroms in each of two sequential sputtering stations would allow processing of 3666 wafers between cleanings of the sputter system. Thus the step of exposing the bottom W/Ti layer to air before depositing Al/Cu can be used to further decrease the frequency with which the sputter system is shut down for cleaning.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method of forming a metal layer on a semiconductor wafer, the steps of the method comprising, in sequence:
   forming a tungsten/titanium layer on a semiconductor wafer by sputtering tungsten/titanium onto said semiconductor wafer in an evacuated chamber;
   exposing said tungsten/titanium layer to air; and
   then, forming an aluminum layer over said tungsten/titanium layer on said semiconductor wafer;
   whereby said step of exposing said tungsten/titanium layer causes at least partial oxidation of the titanium in said tungsten/titanium layer.

2. The method of forming a metal layer on a semiconductor wafer set forth in claim 1, further including the steps of:
   forming a second tungsten/titanium layer over said aluminum layer; said tungsten/titanium, aluminum and second tungsten/titanium layers together comprising a metal layer on said semiconductor wafer; and
   then, masking and patterning said metal layer to form a patterned set of metal interconnections.

3. A method of forming a metal layer on a semiconductor wafer, the steps of the method comprising:
   forming a first portion of a tungsten/titanium layer on a semiconductor wafer by sputtering tungsten/titanium onto said semiconductor wafer in a first evacuated sputter station;
   forming a second portion of said tungsten/titanium layer by sputtering tungsten/titanium on top of said first portion of said tungsten/titanium layer in a second evacuated sputter station; and
   depositing an aluminum layer over said tungsten/titanium layer on said semiconductor wafer;
   whereby forming said tungsten/titanium layer in two steps in two sputter stations reduces the amount of tungsten/titanium deposited onto said sputter stations during the processing of each semiconductor wafer, thereby increasing the number of wafers which can be processed by said sputter stations before said tungsten/titanium deposited on said sputter stations needs to be removed.

4. The method of forming a metal layer on a semiconductor wafer set forth in claim 3, further including the steps of:
   exposing said tungsten/titanium layer to air before said step of depositing an aluminum layer;
   forming a second tungsten/titanium layer over said aluminum layer; said tungsten/titanium, aluminum and second tungsten/titanium layers together comprising a metal layer on said semiconductor wafer; and
   then, masking and patterning said metal layer to form a patterned set of metal interconnections;
   whereby said step of exposing said tungsten/titanium layer to air causes at least partial oxidation of said tungsten/titanium layer and decreases resistivity and improves diffusion barrier performance of said metal layer.

5. A method of forming metal layers on semiconductor wafers, the steps of the method comprising:
   sequentially processing semiconductor wafers by depositing on each semiconductor wafer on a metal layer, said step of depositing a metal layer on each semiconductor wafer including the steps of:
       forming a first portion of a tungsten/titanium layer on a semiconductor wafer by sputtering tungsten/titanium onto said semiconductor wafer in a first evacuated sputter station;
       forming a second portion of said tungsten/titanium layer by sputtering tungsten/titanium on top of said first portion of said tungsten/titanium layer in a second evacuated sputter station; and
       depositing an aluminum layer over said tungsten/titanium layer on said semiconductor wafer;
       said first and second forming steps also depositing tungsten/titanium onto said first and second sputter stations and thereby forming a tungsten/titanium layer inside said sputter stations which increases in thickness with the processing of each said semiconductor wafer; and
   removing said tungsten/titanium layer inside said sputter stations when the thickness of said layer exceeds a predefined threshold value;
   whereby forming said tungsten/titanium layer for each semiconductor wafer in two steps in two sputter stations reduces the amount of tungsten/titanium deposited onto said sputter stations during the processing of each semiconductor wafer, thereby increasing the number of wafers which can be processed by said sputter stations before said tungsten/titanium deposited on said sputter stations needs to be removed.

6. The method of forming metal layers on semiconductor wafers set forth in claim 5, said step of depositing a metal layer on each semiconductor wafer further including the steps of:
   exposing said tungsten/titanium layer formed on each semiconductor wafer to air before said step of depositing an aluminum layer;
   forming a second tungsten/titanium layer over said aluminum layer; said tungsten/titanium, aluminum and second tungsten/titanium layers together comprising a metal layer on said semiconductor wafer; and then, masking and patterning said metal layer to form a patterned set of metal interconnections;

whereby said step of exposing said tungsten/titanium layer to air causes at least partial oxidation of the titanium in said tungsten/titanium layer and thereby decreases resistivity and improves diffusion barrier performance of said metal layer.

7. A system for forming a metal layer on a semiconductor wafer, comprising:

a first evacuated sputter station which deposits a first portion of a first tungsten/titanium layer on a semiconductor wafer;

a second evacuated sputter station which receives said semiconductor wafer from said first evacuated sputter station and which deposits a second portion of said first tungsten/titanium layer on top of said first portion of said tungsten/titanium layer;

a third evacuated sputter station which receives said semiconductor wafer after processing of said semiconductor wafer in said second evacuated sputter station and which deposits an aluminum layer over said first tungsten/titanium layer on said semiconductor wafer;

a fourth evacuated sputter station which receives said semiconductor wafer after processing of said semiconductor wafer in said third evacuated sputter station and which deposits a second tungsten/titanium layer over said aluminum layer; said first tungsten/titanium, aluminum and second tungsten/titanium layers together comprising a metal layer on said semiconductor wafer;

said first and second sputter stations forming a tungsten/titanium layer inside said first and second sputter stations which increases in thickness with the processing of each said semiconductor wafer; and whereby said system forms said first tungsten/titanium layer for each semiconductor wafer in two steps in two sequential sputter stations, which reduces the amount of tungsten/titanium deposited inside each said sputter station during the processing of each semiconductor wafer, thereby increasing the number of wafers which can be processed by said sputter stations before said tungsten/titanium deposited inside said first and second sputter stations exceeds a prefefined threshold thickness, at which time said system needs to be shut down so as to remove tungsten/titanium deposited inside said first and second sputter stations.

8. The system for forming a metal layer on a semiconductor wafer set forth in claim 7, further including a wafer movement system which receives said semiconductor wafer after processing in said second evacuated sputter station, exposes said semiconductor wafer to air, and delivers said semiconductor wafer to said third sputter station;

whereby exposing said first tungsten/titanium layer to air causes at least partial oxidation of said tungsten/titanium layer, decreases resistivity of said metal layer and improves diffusion barrier performance of said metal layer.

* * * * *